(12) United States Patent
Kim et al.

(10) Patent No.: US 12,127,394 B2
(45) Date of Patent: Oct. 22, 2024

(54) SEMICONDUCTOR DEVICES HAVING BURIED GATES

(71) Applicant: SAMSUNG ELECTRONICS CO., LTD., Suwon-si (KR)

(72) Inventors: Huijung Kim, Seongnam-si (KR); Minwoo Kwon, Seoul (KR); Sangyeon Han, Suwon-si (KR); Sangwon Kim, Seoul (KR); Junsoo Kim, Seongnam-si (KR); Hyeonjin Shin, Suwon-si (KR); Eunkyu Lee, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/298,230

(22) Filed: Apr. 10, 2023

(65) Prior Publication Data

US 2023/0247824 A1  Aug. 3, 2023

Related U.S. Application Data

(62) Division of application No. 17/318,563, filed on May 12, 2021, now Pat. No. 11,626,409.

(30) Foreign Application Priority Data

Sep. 8, 2020  (KR) .................. 10-2020-0114405

(51) Int. Cl.
*H10B 12/00* (2023.01)
*H01L 21/28* (2006.01)
(Continued)

(52) U.S. Cl.
CPC ....... *H10B 12/34* (2023.02); *H01L 21/28026* (2013.01); *H01L 29/42356* (2013.01);
(Continued)

(58) Field of Classification Search
CPC .... H10B 12/34; H10B 12/053; H10B 12/315; H01L 29/42356; H01L 29/4236; H01L 29/7813; H01L 21/28026
See application file for complete search history.

(56) References Cited

U.S. PATENT DOCUMENTS 7,586,152 B2  9/2009  Lee et al.
8,174,064 B2  5/2012  Jang
(Continued)

FOREIGN PATENT DOCUMENTS

CN      110178498      8/2019
JP    2020-087937 A2   6/2020
(Continued)

*Primary Examiner* — Joseph C. Nicely
(74) *Attorney, Agent, or Firm* — F. Chau & Associates, LLC

(57) ABSTRACT

A semiconductor device includes a substrate including an active region, a gate structure disposed in a gate trench in the substrate, a bit line disposed on the substrate and electrically connected to the active region on one side of the gate structure, and a capacitor disposed on the bit line and electrically connected to the active region on another side of the gate structure. The gate structure includes a gate dielectric layer disposed on bottom and inner side surfaces of the gate trench, a conductive layer disposed on the gate dielectric layer in a lower portion of the gate trench, sidewall insulating layers disposed on the gate dielectric layer, on an upper surface of the conductive layer, a graphene conductive layer disposed on the conductive layer, and a buried insulating layer disposed between the sidewall insulating layers on the graphene conductive layer.

19 Claims, 16 Drawing Sheets

(51) Int. Cl.
*H01L 29/423* (2006.01)
*H01L 29/78* (2006.01)

(52) U.S. Cl.
CPC ...... *H01L 29/4236* (2013.01); *H01L 29/7813* (2013.01); *H10B 12/053* (2023.02); *H10B 12/315* (2023.02)

(56) References Cited

U.S. PATENT DOCUMENTS

| | | |
|---|---|---|
| 8,912,098 B2 | 12/2014 | Guo et al. |
| 9,136,270 B2 | 9/2015 | Kim et al. |
| 9,472,646 B2 | 10/2016 | Oh |
| 9,513,244 B2 | 12/2016 | Koester |
| 9,608,101 B2 | 3/2017 | Kis et al. |
| 11,133,316 B2 | 9/2021 | Kim et al. |
| 11,189,622 B1 * | 11/2021 | Yang ................ H01L 29/4236 |
| 2008/0061320 A1 | 3/2008 | von Kluge et al. |
| 2009/0068817 A1 | 3/2009 | Eun |
| 2014/0011459 A1 | 1/2014 | Kim et al. |
| 2016/0349073 A1 | 12/2016 | Kang |
| 2017/0018675 A1 | 6/2017 | Kang et al. |
| 2018/0034218 A1 | 2/2018 | Kim |
| 2018/0174848 A1 | 6/2018 | Jang et al. |
| 2019/0027480 A1 | 1/2019 | Lee et al. |
| 2019/0259839 A1 | 8/2019 | Ryu |
| 2020/0105765 A1 | 4/2020 | Kim et al. |
| 2022/0077154 A1 | 3/2022 | Kim et al. |

FOREIGN PATENT DOCUMENTS

| | | |
|---|---|---|
| KR | 10-2011-0115319 A | 10/2011 |
| TW | 201834031 | 9/2018 |
| TW | 201901937 | 1/2019 |

* cited by examiner

SEMICONDUCTOR DEVICES HAVING BURIED GATES

CROSS-REFERENCE TO RELATED APPLICATION

This application is a Division of co-pending U.S. patent application Ser. No. 17/318,563, filed on May 12, 2021, which claims benefit of, and priority under 35 U.S.C. § 119 to, Korean Patent Application No. 10-2020-0114405 filed on Sep. 8, 2020 in the Korean Intellectual Property Office, the disclosures of which are herein incorporated by reference in their entirety.

TECHNICAL FIELD

The present disclosure relates to a semiconductor device, and more particularly to a semiconductor device having buried gates.

DISCUSSION OF THE RELATED ART

As the electronics industry continued to develop and the demands of users increase, electronic devices are becoming more compact and higher-performance. Accordingly, semiconductor devices used in electronic devices are designed to have high integration and high performance. Burying the gate electrodes within a semiconductor substrate is one way in which semiconductors may be made more highly integrated.

SUMMARY

A semiconductor device may include a substrate including an active region, a gate structure extending in a first direction in a gate trench in the substrate, a bit line extending in a second direction, intersecting the first direction, on the substrate, and electrically connected to the active region on one side of the gate structure, and a capacitor disposed on the bit line, and electrically connected to the active region on the other side of the gate structure. The gate structure may include a gate dielectric layer disposed on a bottom surface and inner side surfaces of the gate trench, a first conductive layer disposed on the gate dielectric layer, in a lower portion of the gate trench, sidewall insulating layers disposed on the gate dielectric layer, on an upper surface of the first conductive layer, a second conductive layer disposed on the first conductive layer and including graphene, and a buried insulating layer filling a space between the sidewall insulating layers on the second conductive layer.

A semiconductor device may include a substrate including an active region and a gate structure in a gate trench in the substrate. The gate structure may include a gate dielectric layer disposed on a bottom surface and inner side surfaces of the gate trench. A gate electrode layer is disposed on the gate dielectric layer in a lower portion of the gate trench. The gate electrode includes first and second metal layers including a metal material that are sequentially stacked, and a graphene layer at least partially surrounding outer side surfaces and a lower surface of at least one of the first and second metal layers and including graphene. A buried insulating layer is disposed on an upper surface of the gate electrode layer.

A semiconductor device may include a substrate including an active region having source/drain regions, a gate electrode layer buried in the substrate, and including a plurality of metal layers buried in the substrate and disposed to at least partially overlap in a direction perpendicular to an upper surface of the substrate, and a graphene layer at least partially covering a lower surface of any one of the plurality of metal layers. A gate dielectric layer is disposed between the active region and the gate electrode layer.

BRIEF DESCRIPTION OF DRAWINGS

A more complete appreciation of the present disclosure and many of the attendant aspects thereof will be readily obtained as the same will be more clearly understood from the following detailed description, taken in conjunction with the accompanying drawings, in which.

DETAILED DESCRIPTION

Hereinafter, embodiments of the present inventive concept will be described with reference to the accompanying drawings.

Figure 1:
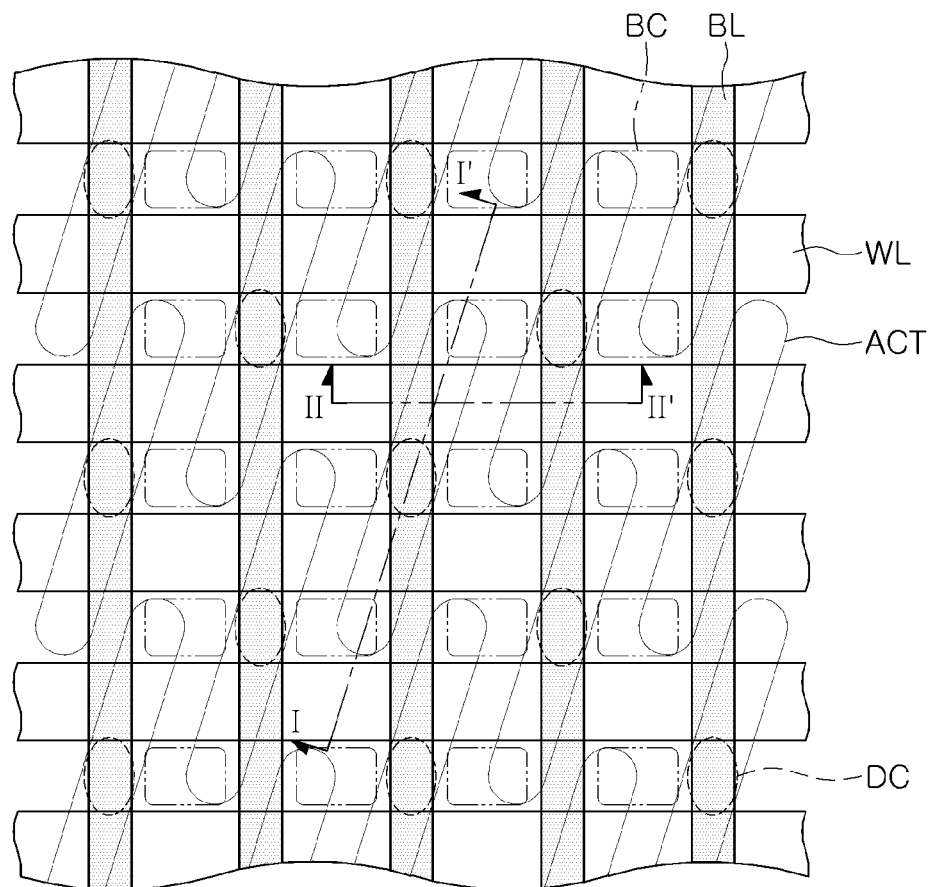
FIG. 1 is a schematic layout diagram illustrating a semiconductor device according to example embodiments of the present disclosure.
Figure 2A:
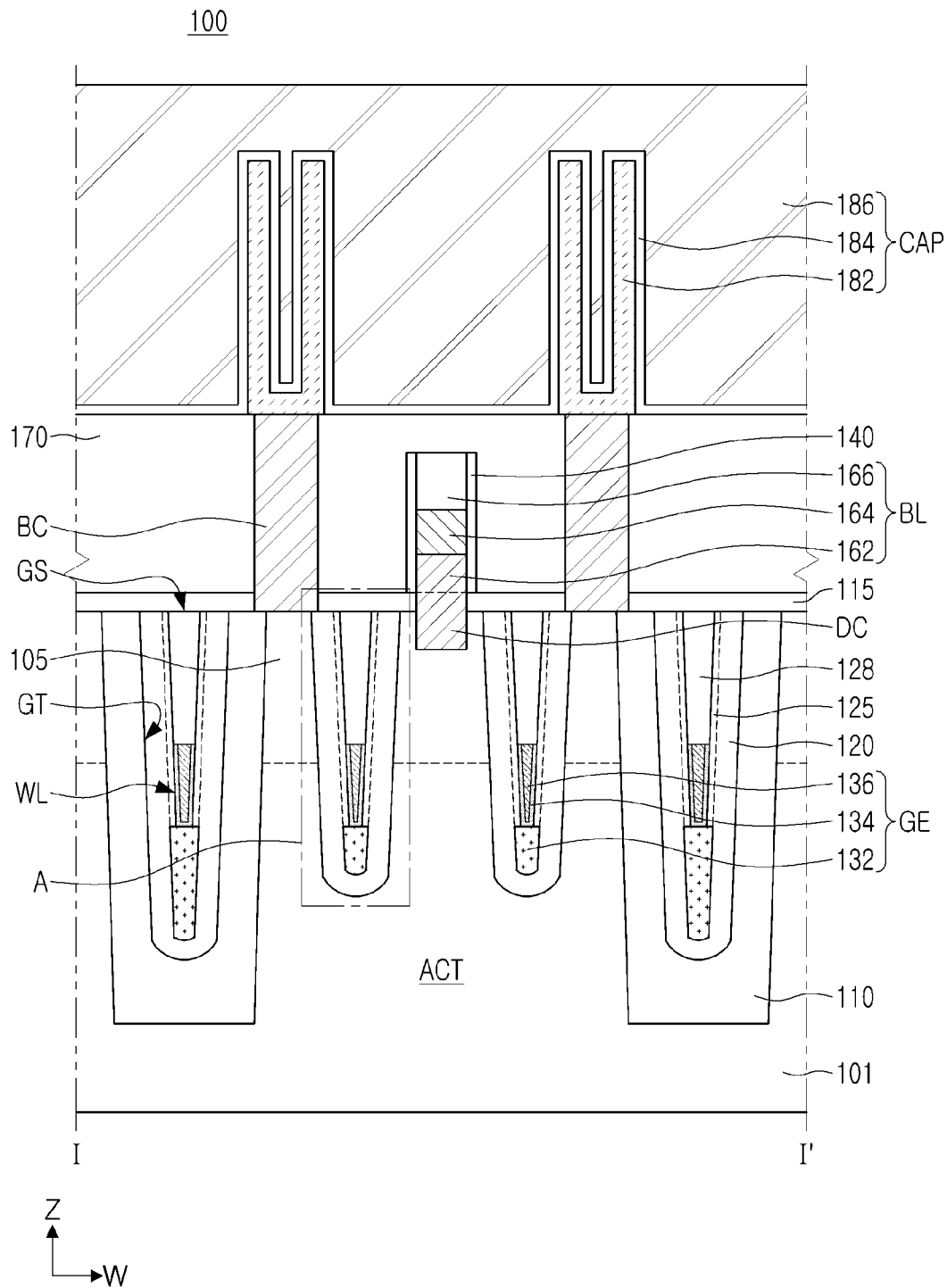
FIGS. 2A and 2B are schematic cross-sectional views illustrating semiconductor devices according to example embodiments of the present disclosure.
Figure 2B:
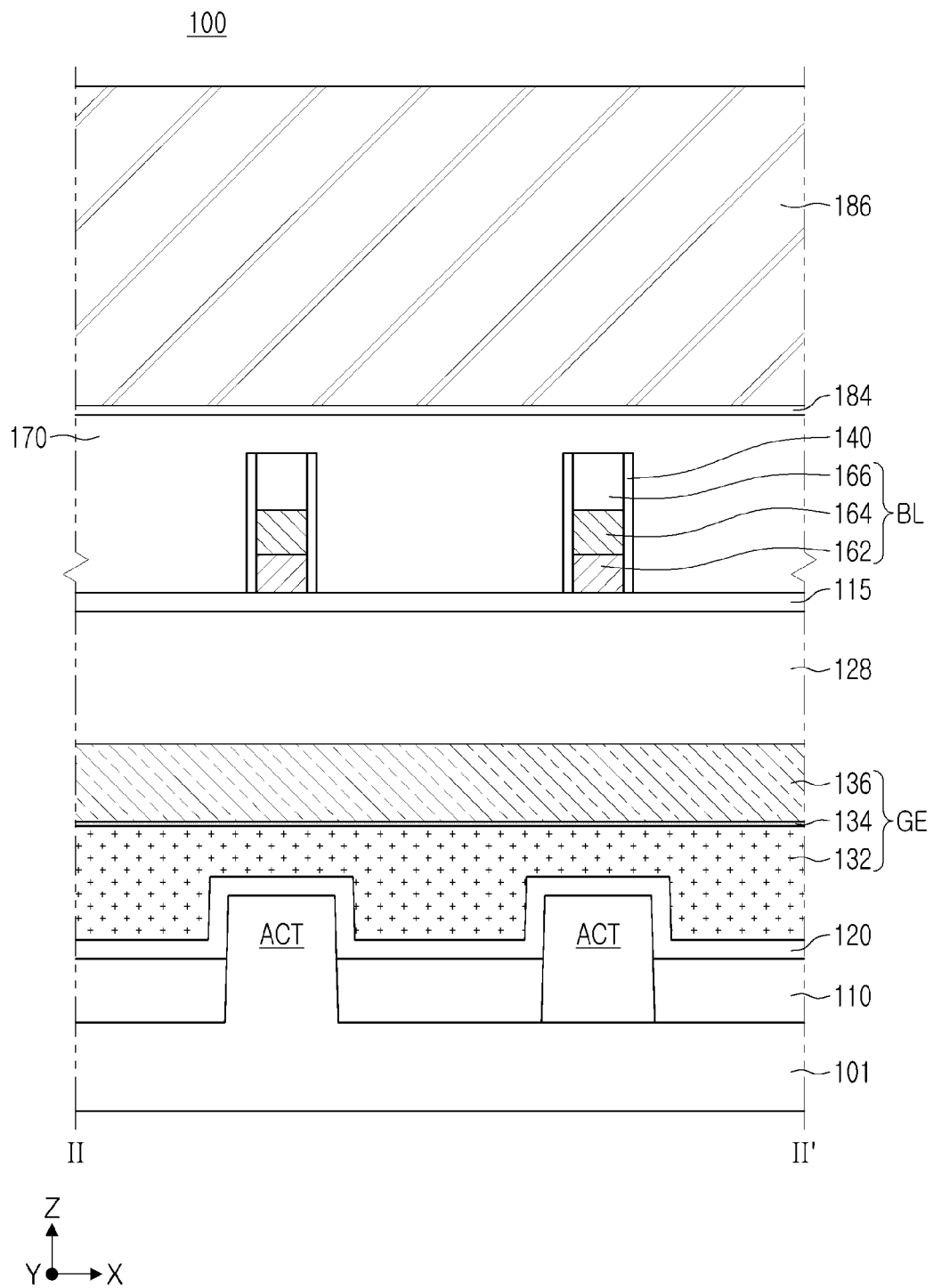
Figure 3:
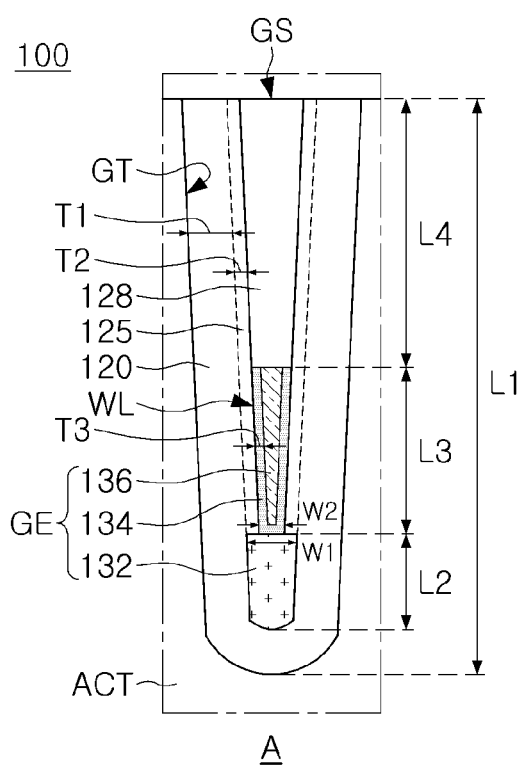
FIG. 3 is a partially enlarged view illustrating a semiconductor device according to example embodiments of the present disclosure.

FIG. 1 is a schematic layout diagram illustrating a semiconductor device according to example embodiments. FIGS. 2A and 2B are schematic cross-sectional views illustrating semiconductor devices according to example embodiments. FIG. 2A is a cross-sectional view taken along the cutting line I-I' of FIG. 1, and FIG. 2B is a cross-sectional view taken along the cutting line II-II' of FIG. 1. FIG. 3 is a partially enlarged view illustrating a semiconductor device according to example embodiments. FIG. 3 is an enlarged view illustrating region 'A' of FIG. 2A.

Referring to FIGS. 1 to 3, a semiconductor device 100 may include a substrate 101 including active regions ACT, gate structures GS buried and extended in the substrate 101. The semiconductor device 100 may further include a word line WL, a bit lines BL intersecting the word line WL, direct contacts DC electrically connecting the bit lines BL and the active regions ACT to each other, capacitors CAP disposed on an upper portion of the bit lines BL, and storage node contacts BC electrically connecting the capacitors CAP and the active regions ACT to each other. The semiconductor device 100 may further include device isolation layers 110 defining active regions ACT, a lower insulating layer 115 and an interlayer insulating layer 170 disposed on the substrate 101, and bit line spacers 140 on sidewalls of the bit lines BL. The semiconductor device 100 may be applied to, for example, a cell array region of a dynamic random access memory (DRAM), but the present invention is not necessarily limited thereto.

The substrate 101 may have an upper surface extending in an X direction and a Y direction. The substrate 101 may include a semiconductor material, such as a Group IV semiconductor, a Group III-V compound semiconductor, and/or a Group II-VI compound semiconductor. For example, the Group IV semiconductor may include silicon, germanium or silicon-germanium. The substrate 101 may be doped or ion-implanted with impurities. The substrate 101 may be a silicon on insulator (SOI) substrate, a germanium on insulator (GOI) substrate, a silicon-germanium substrate, or a substrate including an epitaxial layer.

The active regions ACT may be defined in the substrate 101 by the device isolation layers 110. The active regions ACT may have a bar shape and may be disposed in the substrate 101 in an island shape extending in one direction, for example, in a W direction. The W direction may be a direction inclined with respect to an extension direction of the word lines WL and the bit lines BL.

The active regions ACT may have an impurity region 105 having a predetermined depth from the upper surface of the substrate 101. The impurity region 105 may be provided as a source/drain region of a transistor constituted by the gate structure GS. For example, a drain region may be formed between two gate structures GS intersecting one active region ACT, and a source region may be formed outside of the two gate structures GS, respectively. The source region and the drain region are formed by the impurity region 105 by doping or ion implantation of substantially the same impurities, and may be referred to interchangeably, according to a circuit configuration of a transistor to be finally formed. The impurity region 105 may be formed to a depth lower than the upper surface of the gate electrode layer GE, but the present invention is not necessarily limited thereto. In example embodiments, the depth of the impurity region 105 in the source region and the drain region may be different from each other.

The device isolation layers 110 may be formed by a shallow trench isolation (STI) process. The device isolation layers 110 may at least partially surround the active regions ACT and electrically isolate the active regions ACT from each other. The device isolation layers 110 may be made of an insulating material, for example, an oxide, a nitride, or a combination thereof.

The gate structures GS may include word lines WL, and may be disposed in gate trenches GT extending from an upper surface of the substrate 101. The gate structures GS may extend in one direction, for example, in the X direction, across the active regions ACT in the substrate 101. For example, a pair of gate structures GS may intersect one active region ACT. The gate structures GS may include buried word lines WL constituting a buried channel array transistor (BCAT), respectively. Each of the gate structure GS may include a gate dielectric layer 120, sidewall insulating layers 125, a gate electrode layer GE, and a buried insulating layer 128.

The gate trenches GT may have a greater depth in the device isolation layers 110 than in the active regions ACT. Accordingly, as shown in FIG. 2B, the gate electrode layer GE may extend on an upper portion of the active regions ACT while partially surrounding the side surfaces of the active regions ACT.

The gate dielectric layer 120 may be disposed on a bottom surface and inner side surfaces of the gate trench GT. The gate dielectric layer 120 may include at least one of an oxide, a nitride, and an oxynitride. The gate dielectric layer 120 may be, for example, a silicon oxide film or an insulating film having a high dielectric constant(e.g., a dielectric constant greater than that of silicon oxide, which may be referred to herein as a "high-k" material). In example embodiments, the gate dielectric layer 120 may be a layer formed by oxidation of the active region ACT or a layer formed by deposition.

The sidewall insulating layers 125 may be disposed at a predetermined depth from the upper portion of the gate trench GT. In the gate trench GT, the sidewall insulating layers 125 may be disposed on the upper surface of the first conductive layer 132 and may be disposed on the inner side surfaces of the gate dielectric layer 120. Each of the sidewall insulating layers 125 may have a second thickness T2, smaller than the first thickness T1 of the gate dielectric layer 120. For example, the first thickness T1 may range from about 2 times to about 7 times the second thickness T2. The sidewall insulating layers 125 may include at least one of an oxide, a nitride, and an oxynitride. For example, the sidewall insulating layers 125 may be silicon oxide layers. The sidewall insulating layers 125 may include the same material as the gate dielectric layer 120 or may include a different material therefrom. When the sidewall insulating layers 125 are made of the same material as the gate dielectric layer 120, an interface with the gate dielectric layer 120 might not be distinguishable. However, even in this case, a region in which the sidewall insulating layers 125 are formed may be recognized by a difference in width from the region in which the sidewall insulating layers 125 are not formed.

The gate electrode layer GE may include a first conductive layer 132 disposed in a lower portion of the gate trench GT, a second conductive layer 134 disposed on the gate dielectric layer 120 on the upper surface of the first conductive layer 132, and a third conductive layer 136 filling a region within the second conductive layer 134.

The first conductive layer 132 may fill a region between the gate dielectric layer 120 in the lower portion of the gate trench GT, and may have a predetermined thickness or height. The first conductive layer 132 is a first metal layer including a metal material, and may include at least one of, for example, titanium (T1), titanium nitride (TiN), tantalum (Ta), and tantalum nitride (TaN). For example, the first conductive layer 132 may be formed of a dual layer of titanium (T1) and titanium nitride (TiN).

The second conductive layer 134 may extend in a form of a liner in a lower portion of the sidewall insulating layers 125 to cover inner side surfaces of the sidewall insulating layers 125 and the upper surface of the first conductive layer 132. The second conductive layer 134 may extend to a substantially uniform thickness. An upper surface of the second conductive layer 134 may contact the buried insulating layer 128. The second conductive layer 134 may be interposed between the first conductive layer 132 and the third conductive layer 136, and may at least partially surround the outer side surfaces and the lower surface of the third conductive layer 136. The second conductive layer 134 may be at least partially surrounded by a first conductive layer 132, sidewall insulating layers 125, a third conductive layer 136, and a buried insulating layer 128. Due to the sidewall insulating layers 125, in a region, adjacent to the interface between the first conductive layer 132 and the second conductive layer 134, a width W2 of the second conductive layer 134 may be smaller than the first width W1 of the first conductive layer 132. The second conductive layer 134 may be a graphene layer including graphene. Graphene has a two-dimensional structure of a honeycomb consisting of one or more layers of carbon atoms. Since graphene is a material having relatively low resistivity, the overall resistance of the gate electrode layer GE may be reduced by the second conductive layer 134. For example, the second conductive layer 134 may have a third thickness T3 ranging from about 6 Å to about 50 Å.

The third conductive layer 136 may be disposed so that outer side surfaces and a lower surface thereof are at least partially surrounded by the second conductive layer 134. An upper surface of the third conductive layer 136 may be substantially coplanar with the upper surface of the second conductive layer 134. The third conductive layer 136 may include at least one of, for example, titanium (Ti), titanium nitride (TiN), tantalum (Ta), and tantalum nitride (TaN), as a second metal layer including a metal material. For example, the third conductive layer 136 may include the same material as the first conductive layer 132 or may be made of a different material.

In the gate electrode layer GE, the first conductive layer 132 may be disposed in contact with the gate dielectric layer 120, to constitute a gate portion of a transistor. In the gate electrode layer GE, the second conductive layer 134 and the third conductive layer 136 disposed inside the sidewall insulating layers 125 may constitute a word line portion functioning as a word line WL.

The buried insulating layer 128 may be disposed on the second conductive layer 134 and the third conductive layer 136 to fill the gate trench GT. The buried insulating layer 128 may be made of an insulating material, for example, a silicon nitride layer.

In the active region ACT, the gate trenches GT may have a first length L1 in a direction that is perpendicular to the upper surface of the substrate, for example, a Z direction. For example, the first length L1 may range from about 900 Å to about 1100 Å. In the present embodiment, graphene having relatively low resistivity may be applied to the second conductive layer 134, while preventing defects such as bending, or the like, in the gate structure GS by relatively reducing the first length L1, such that the resistivity of the gate electrode layer GE can be secured. In addition, by disposing the sidewall insulating layer 125 on the upper sidewall of the gate electrode layer GE, an occurrence of a gate induced drain leakage current (GIDL) may be minimized, and even in this case, the resistivity may be secured by the second conductive layer 134.

The second length L2 of the first conductive layer 132 in the Z direction may be smaller than the third length L3 of the second conductive layer 134. The second length L2 of the first conductive layer 132 may be smaller than the length of the third conductive layer 136. The third length L3 of the second conductive layer 134 may be smaller than the fourth length L4 of the buried insulating layer 128, but the present invention is not necessarily limited thereto.

The direct contact DC may be disposed below the bit lines BL, and may be connected to a drain region of the active region ACT. The direct contact DC may penetrate through the lower insulating layer 115, to electrically connect the drain region to the bit line BL. The storage node contact BC may be connected to a source region of the active region ACT. The storage node contact BC may penetrate through the lower insulating layer 115 and the interlayer insulating layer 170, to electrically connect the source region and the capacitor CAP. The storage node contacts BC may be arranged in a row in the X and Y directions. In example embodiments, the shapes and structures of the direct contact DC and the storage node contacts BC may be variously changed. For example, separate contact spacers may be further disposed on side surfaces of the direct contact DC. For example, the storage node contacts BC may be disposed in a form in which the substrate 101 is recessed, and may include landing pads disposed thereon.

The direct contact DC and the storage node contact BC may be made of a conductive material, and may include, for example, polycrystalline silicon and/or a metal material.

The lower insulating layer 115 and the interlayer insulating layer 170 may at least partially cover the upper surface of the substrate 101. The lower insulating layer 115 and the interlayer insulating layer 170 may include an insulating material, and may include, for example, at least one of an oxide, a nitride, and an oxynitride.

The bit lines BL may extend in one direction, for example, a Y direction, perpendicular to the gate structure GS. The bit lines BL may include a first bit line conductive layer 162, a second bit line conductive layer 164 on the first bit line conductive layer 162, and a capping layer 166 on the second bit line conductive layer 164.

The first bit line conductive layer 162 may be a semiconductor layer, and may contact an upper surface of the direct contact DC. The second bit line conductive layer 164 may include a metal material, and may also be formed of, for example, a dual layer comprising a metal layer and a metal silicide layer. The capping layer 166 may include an insulating material.

The bit line spacers 140 may be disposed on opposite sidewalls of the bit lines BL. The bit line spacers 140 may be formed of an oxide film, a nitride film, an air spacer, or a combination thereof. The air spacer may include gases that may exist in the atmosphere or generated during a manufacturing process of a semiconductor device.

The capacitor CAP may include a lower electrode 182, a capacitor dielectric layer 184, and an upper electrode 186. The lower electrode 182 and the upper electrode 186 may include at least one of a doped semiconductor, a metal nitride, a metal, and a metal oxide. The lower electrode 182 and the upper electrode 186 may include at least one of, for example, polycrystalline silicon, titanium nitride (TiN), tungsten (W), titanium (Ti), ruthenium (Ru), and tungsten nitride (WN). The capacitor dielectric layer 184 may include at least one high-k material, for example, such as zirconium oxide ($ZrO_2$), aluminum oxide ($Al_2O_3$), and hafnium oxide ($Hf_2O_3$). The capacitor CAP is illustrated as having a cylindrical shape, but is not limited thereto, and in example embodiments, the capacitor CAP may also have a pillar shape.

Figure 4A:
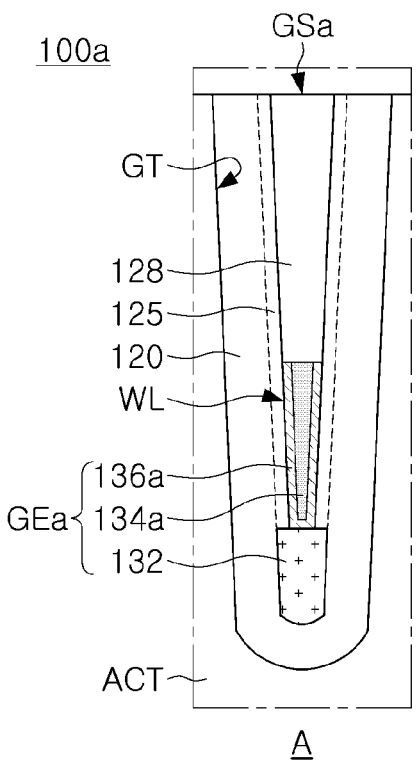
FIGS. 4A, 4B, and 4C are cross-sectional views and partially enlarged views illustrating a semiconductor device according to example embodiments.
Figure 4B:
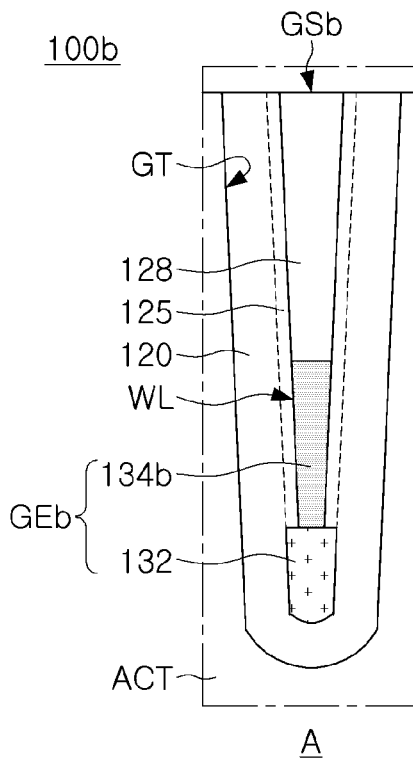
Figure 4C:
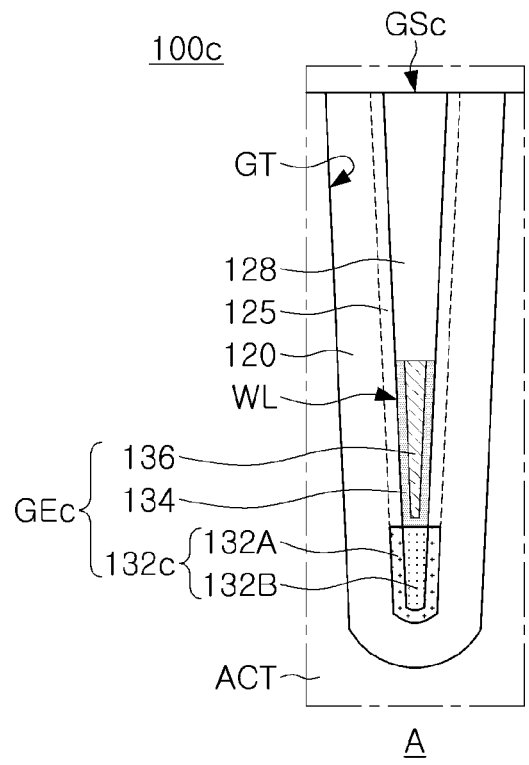

FIGS. 4A to 4C are partially enlarged views illustrating semiconductor devices according to example embodiments. FIGS. 4A to 4C are enlarged views illustrating an area corresponding to region 'A' of FIG. 2A.

Referring to FIG. 4A, in a gate structure GSa of a semiconductor device 100a, a gate electrode layer GEa may include a first conductive layer 132 disposed in a lower portion of a gate trench GT, a third conductive layer 136a disposed on the gate dielectric layer 120 on the upper surface of the first conductive layer 132, and a second conductive layer 134a filling a region within the third conductive layer 136a. The second conductive layer 134a may be at least partially surrounded by the third conductive layer 136a and the buried insulating layer 128.

The gate electrode layer GEa may have different dispositions of the second conductive layer 134a and the third conductive layer 136a, as compared to the embodiments of FIGS. 2A to 3. In the present embodiment, the second conductive layer 134a may have a larger volume than the third conductive layer 136a, but the present invention is not necessarily limited thereto. A relative volume of the second conductive layer 134a and the third conductive layer 136a may be selected in consideration of total resistance of the gate electrode layer GEa and process difficulty.

Referring to FIG. 4B, in a gate structure GSb of a semiconductor device 100b, a gate electrode layer GEb may include a first conductive layer 132 disposed in a lower portion of a gate trench GT, and a second conductive layer 134b filling a region within the gate dielectric layer 120 on the upper surface of the first conductive layer 132. The second conductive layer 134b may be at least partially surrounded by the first conductive layer 132, the sidewall insulating layers 125, and the buried insulating layer 128.

Unlike the arrangement illustrated FIGS. 2A to 3 and 4A, the gate electrode layer GEb might not include the third conductive layers 136 and 136a, and may be disposed such that the second conductive layer 134b has a relatively large volume. Accordingly, the resistance of the gate electrode layer GEb can be minimized, and the depth of the gate trench GT may be further reduced or the width thereof may be further increased. Accordingly, defects such as bending occurring in the gate trench GT can be minimized.

Referring to FIG. 4C, in a gate structure GSc of a semiconductor device 100c, a gate electrode layer GEc may include a first conductive layer 132c disposed in a lower portion of the gate trench GT and including a first layer 132A and a second layer 132B, and a second conductive layer 134 disposed on the gate dielectric layer 120 on the upper surface of the first conductive layer 132, and a third conductive layer 136 filling a region within the second conductive layers 134. Unlike of the arrangement illustrated in FIGS. 2A to 3, the gate electrode layer GEc may include the first conductive layer 132c formed of a plurality of layers including different materials.

The first layer 132A may extend along the inner side surfaces and the upper surface of the gate dielectric layer 120, and the second layer 132B may fill a space within the first layer 132A. The first layer 132A may at least partially surround an outer side surface and a lower surface of the second layer 132B, except for the upper surface of the second layer 132B. The first layer 132A may include a material having a first resistivity, and the second layer 132B may include a material having a second resistivity, lower than the first resistivity. For example, the first layer 132A may include at least one of titanium (T1), titanium nitride (TiN), tantalum (Ta), and tantalum nitride (TaN), and the second layer 132B may include at least one of tungsten (W), aluminum (Al), and copper (Cu).

Figure 5A:
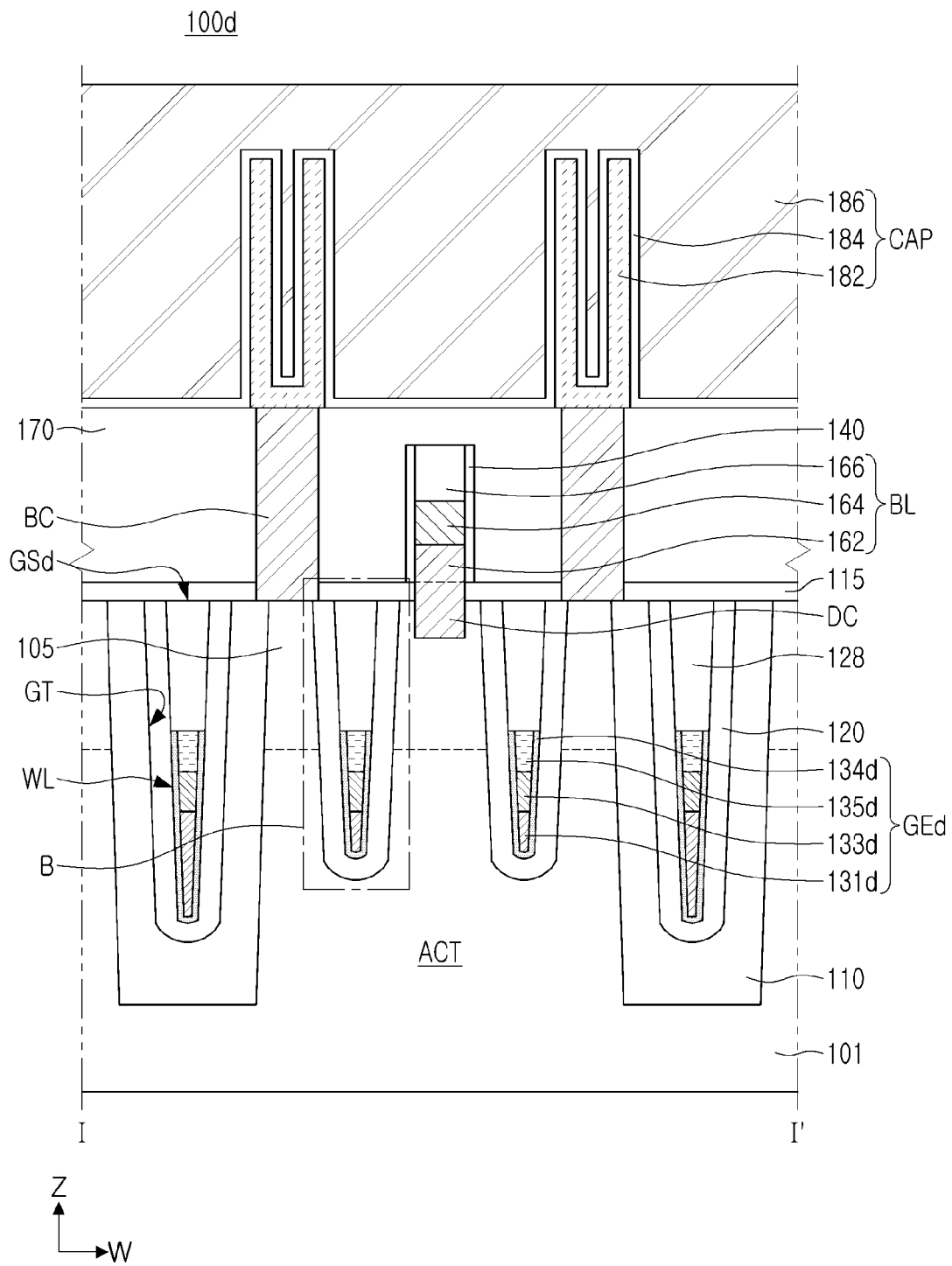
FIGS. 5A and 5B are cross-sectional views and partially enlarged views illustrating a semiconductor device according to example embodiments.
Figure 5B:
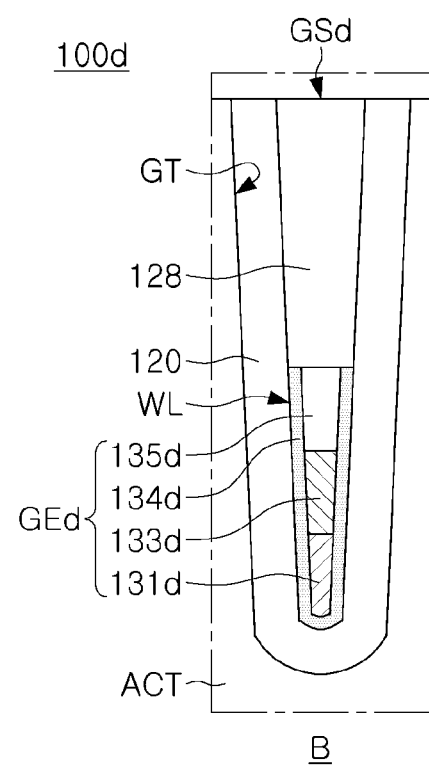

FIGS. 5A and 5B are cross-sectional views and partially enlarged views illustrating a semiconductor device according to example embodiments, respectively. FIG. 5B is an enlarged view of region 'B' of FIG. 5A.

Referring to FIGS. 5A and 5B, a gate structure GSd of a semiconductor device 100d may include a gate dielectric layer 120, a gate electrode layer GEd, and a buried insulating layer 128. The gate electrode layer GEd may include a first metal layer 131d, a second metal layer 133d, and a third metal layer 135d, that are sequentially stacked and disposed on the gate dielectric layer 120 in a lower portion of the gate trench GT. The gate electrode layer GEd may further include a graphene layer 134d at least partially surrounding outer side surfaces of the first metal layer 131d, the second metal layer 133d, and the third metal layer 135d and the lower surface of the first metal layer 131d. To the extent that a detailed description of one or more elements is omitted, it may be assumed that those elements are at least similar to corresponding elements discussed elsewhere in the instant disclosure.

The first metal layer 131d, the second metal layer 133d, and the third metal layer 135d may each include different metal materials. For example, first metal layer 131d may include a material for adjusting a threshold voltage of a transistor, and may include, for example, p-type metal. The second metal layer 133d may include a metal material having resistivity lower than that of the first metal layer 131d and the third metal layer 135d. The second metal layer 133d may adjust the resistivity of a word line WL. The third metal layer 135d may include a material for adjusting a work function together with the graphene layer 134d. The third metal layer 135d may include a material having a different work function from that of the first metal layer 131d, and may include, for example, n-type metal.

For example, the n-type metal may be metal having a work function of 4.3 eV or less, and the p-type metal may be metal having a work function of 4.4 eV or more, but the present invention is not necessarily limited thereto. The third metal layer 135d may be combined with the graphene layer 134d to lower the work function. This is because an interface dipole is formed according to charge transfer between graphene and the metal, thereby suppressing a surface dipole of a surface of the metal. Accordingly, the third metal layer 135d may be selected as a material capable of lowering the overall work function by being combined with the graphene layer 134d even if the work function is not 4.3 eV or less. For example, the third metal layer 135d may include a material having an overall work function, lower than about 4.05 eV by being combined with the graphene layer 134d. For example, the first metal layer 131d may include at least one of titanium nitride (TiN), tungsten (W), nickel (Ni), cobalt (Co), and palladium (Pd), the second metal layer 133d may include at least one of tungsten (W), copper (Cu), gold (Au), and silver (Ag), and the third metal layer 135d may include at least one of titanium (Ti), titanium nitride (TiN), aluminum (Al), and chromium (Cr). In example embodiments, relative thicknesses of the first metal layer 131d, the second metal layer 133d, and the third metal layer 135d may be variously changed.

The graphene layer 134d may be interposed between the first metal layer 131d, the second metal layer 133d, and the third metal layer 135d, and the gate dielectric layer 120, such that an upper surface may be in contact with the buried insulating layer 128 and an outer side surface may be in contact with the gate dielectric layer 120. The upper surface of the graphene layer 134d may be substantially the same as the upper surface of the third metal layer 135d, but the present invention is not necessarily limited thereto. According to example embodiments, the upper surface of the graphene layer 134d may be positioned higher or lower than the upper surface of the third metal layer 135d. The graphene layer 134d may have a thickness smaller than each of the first metal layer 131d, the second metal layer 133d, and the third metal layer 135d. In addition, for the graphene layer 134d, the description of the second conductive layer 134 described above with reference to FIGS. 1 to 3 may be equally applied.

Figure 6A:
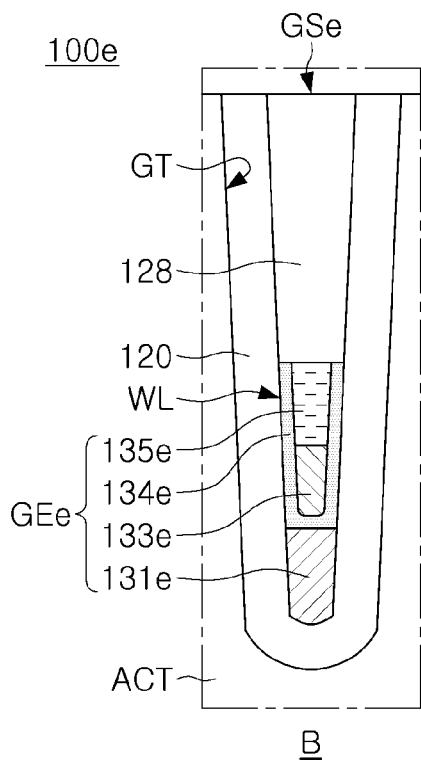
FIGS. 6A to 6C are partially enlarged views illustrating semiconductor devices according to example embodiments.
Figure 6B:
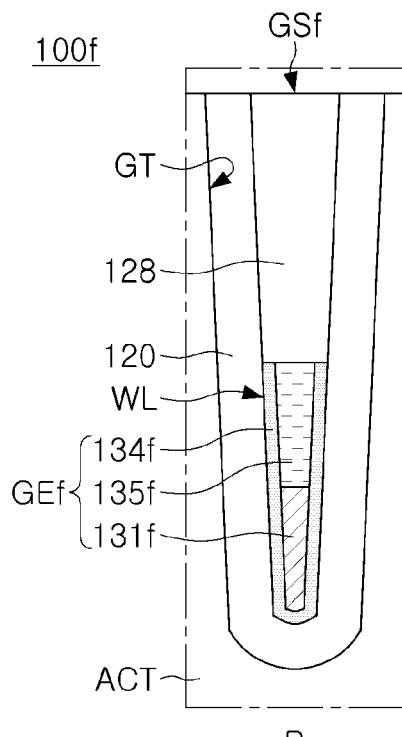
Figure 6C:
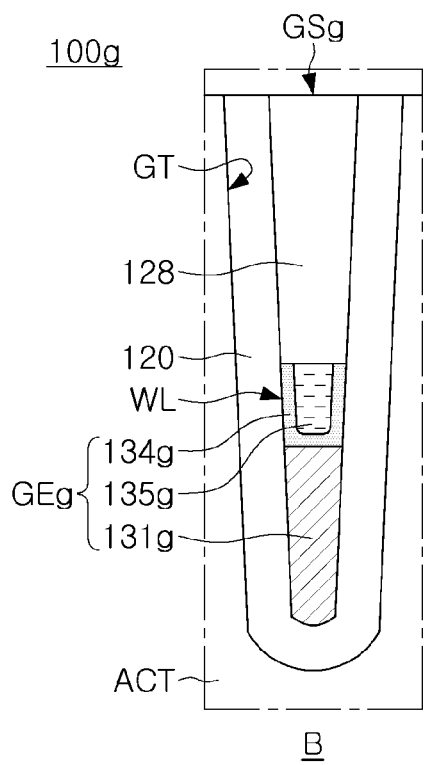

FIGS. 6A to 6C are partially enlarged views of semiconductor devices according to example embodiments. FIGS. 6A to 6C are enlarged views of an area corresponding to region 'B' of FIG. 5A.

Referring to FIG. 6A, in a gate structure GSe of a semiconductor device 100e, the gate electrode layer GEe may include a first metal layer 131e, a second metal layer 133*e*, and a third metal layer 135*e*, that are sequentially stacked and disposed on the gate dielectric layer 120 in a lower portion of the gate trench GT, and may further include a graphene layer 134*e* at least partially surrounding outer side surfaces of the second metal layer 133*e* and the third metal layer 135*e* and a lower surface of the second metal layer 133*e*. The graphene layer 134*e* may extend between the first metal layer 131*e* and the second metal layer 133*e*, so as to contact the upper surface of the first metal layer 131*e* and the lower surface of the second metal layer 133*e*.

Referring to FIG. 6B, in a gate structure GSf of a semiconductor device 100*f*, the gate electrode layer GEf may include a first metal layer 131*f* and a third metal layer 135*f* that are sequentially stacked on the gate dielectric layer 120 in a lower portion of the gate trench GT, and may further include a graphene layer 134*f* at least partially surrounding outer side surfaces of the first metal layer 131*f* and the third metal layer 135*f* and a lower surface of the first metal layer 131*f*.

Referring to FIG. 6C, in a gate structure GSg of a semiconductor device 100*g*, the gate electrode layer GEg may include a first metal layer 131*g* and a third metal layer 135*g* that are sequentially stacked and disposed on the gate dielectric layer 120 in a lower portion of the gate trench GT, and may further include a graphene layer 134*g* at least partially surrounding outer side surfaces and a lower surface of the third metal layer 135*g*. The graphene layer 134*g* may extend between the first metal layer 131*g* and the third metal layer 135*g*, so as to contact the upper surface of the first metal layer 131*g* and the lower surface of the third metal layer 135*g*.

As in the embodiments of FIGS. 6A to 6C, the number of metal layers constituting the gate electrode layers GEe, GEf, and GEg and the dispositional form of the graphene layers may be variously changed as described above, in consideration of the size, a threshold voltage, and resistivity of the gate electrode layers GEe, GEf, and GEg. In example embodiments, the relative thicknesses of the metal layers and the graphene layers constituting the gate electrode layers GEe, GEf, and GEg may be variously changed.

FIGS. 7A to 7H are schematic cross-sectional views illustrating a method of manufacturing a semiconductor device according to example embodiments.

Figure 7A:
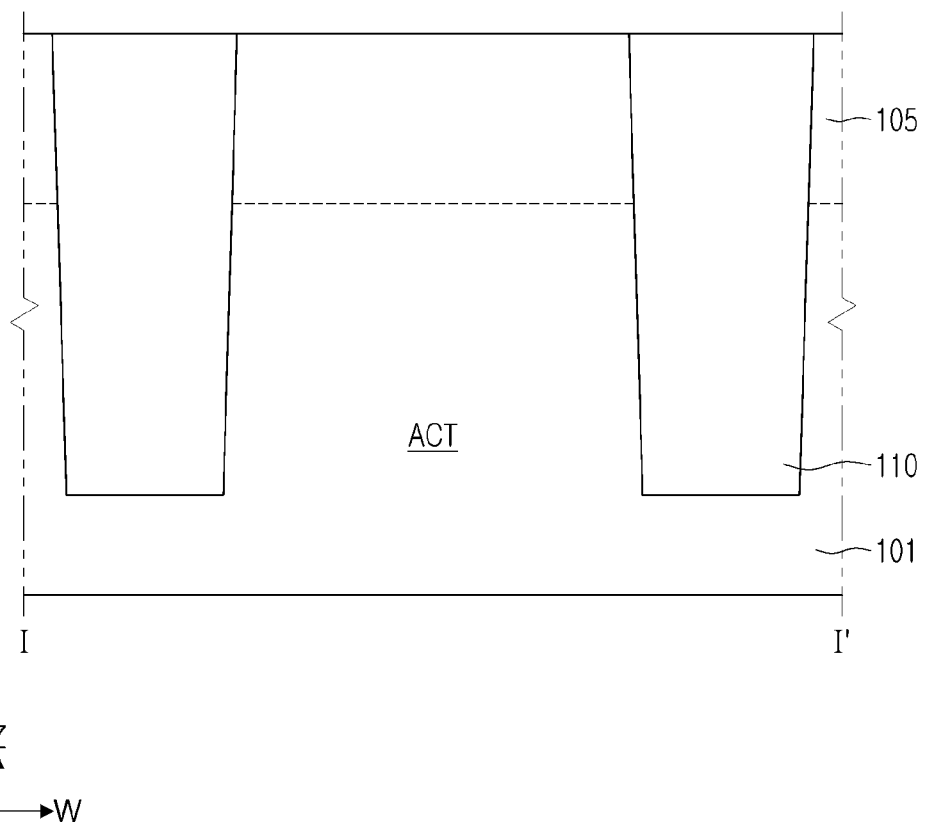
FIGS. 7A to 7H are schematic cross-sectional views illustrating a method of manufacturing a semiconductor device according to example embodiments.

Referring to FIG. 7A, device isolation layers 110 may be formed on a substrate 101 to define active regions ACT.

First, trenches may be formed by anisotropically etching the substrate 101 using a mask layer according to a shallow trench device isolation (STI) process. The device isolation layers 110 may be formed by depositing insulating materials in the trenches and then performing a planarization process. An impurity region 105 may be formed by implanting impurities into the substrate 101 before the device isolation layers 110 are formed. However, according to example embodiments, the impurity region 105 may be formed after the device isolation layers 110 are formed or in other processing steps.

Figure 7B:
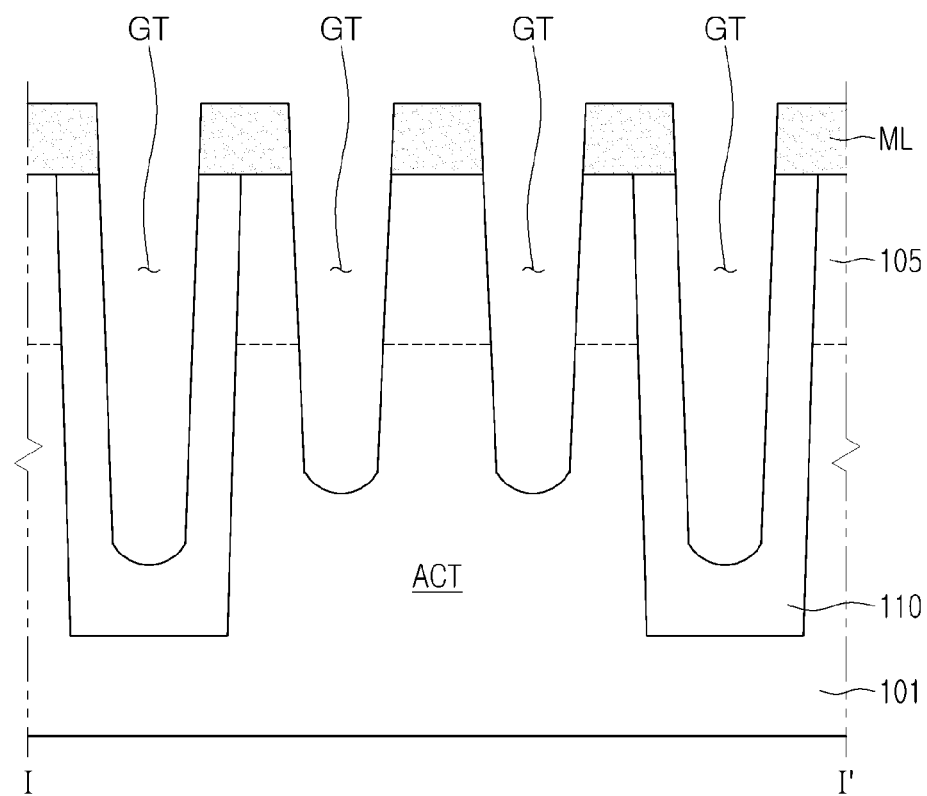

Referring to FIG. 7B, gate trenches GT extending into the substrate 101 may be formed.

The gate trenches GT may be formed by anisotropically etching the substrate 101 using a mask layer ML, and may be formed, for example, using a plasma etching process. The gate trenches GT may intersect the active regions ACT and the device isolation layers 110 and may extend in an X direction. The gate trenches GT may have substantially the same width in a Y direction and a W direction, and may have the same separation distance. The gate trenches GT may be formed to a greater depth in the device isolation layers 110.

This difference in depth may be due to a difference in an etching rate due to different etching materials, but may be intended to use the active regions ACT in a form of fins as shown in FIG. 2B.

In the present step, the gate trenches GT may have a lesser depth. For example, the depth of the gate trenches GT may range from about 900 Å to about 1100 Å. As described above, the gate trenches GT may have a lesser depth to prevent defects such as bending, or the like, while optimizing the structure of the gate structure GS to be formed subsequently, an occurrence of GIDL may be minimized and the resistance of the gate electrode GE may be secured.

Figure 7C:
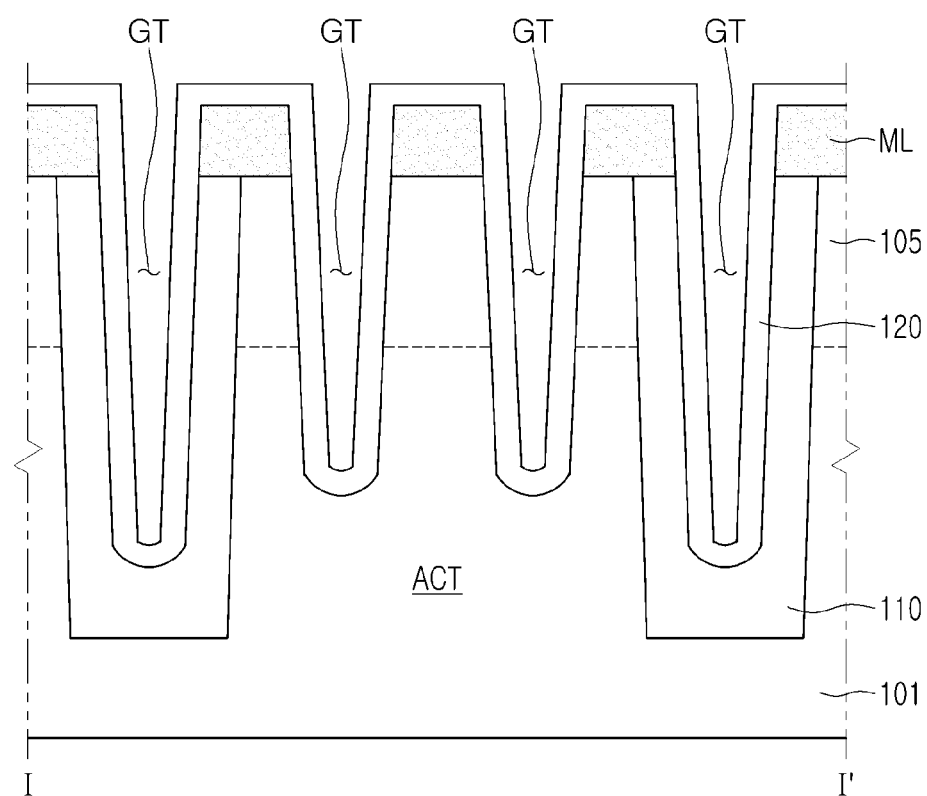

Referring to FIG. 7C, a gate dielectric layer 120 may be formed in the gate trenches GT.

The gate dielectric layer 120 may be formed to have a substantially uniform thickness on inner walls and bottom surfaces of the gate trenches GT. The gate dielectric layer 120 may be formed by an oxidation process of the active region ACT or a deposition process of a dielectric material.

Figure 7D:
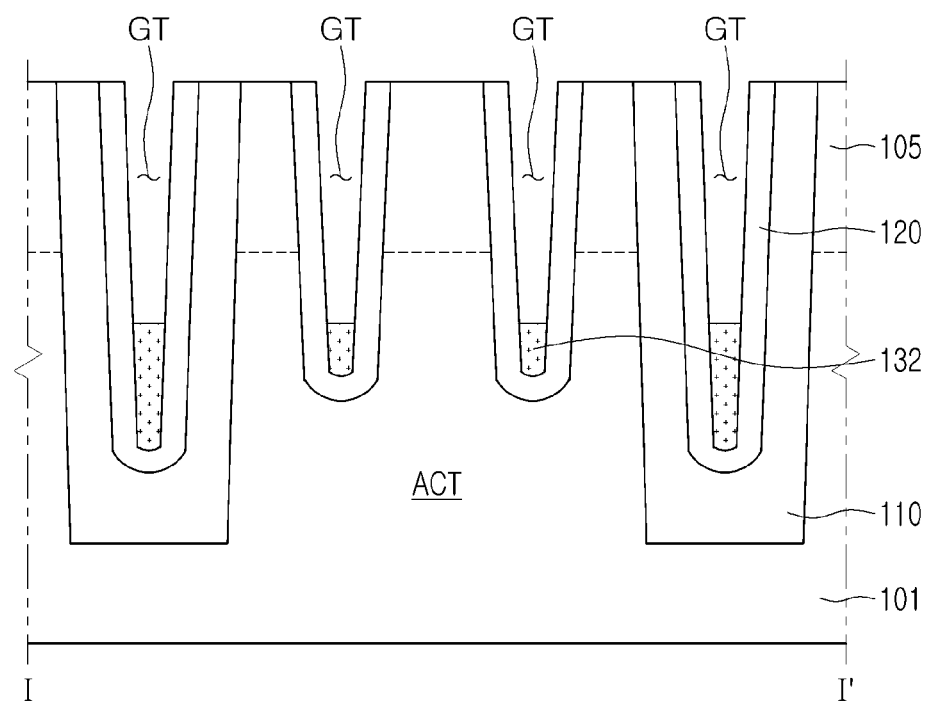

Referring to FIG. 7D, in the gate trenches GT, first conductive layers 132 may be formed on the gate dielectric layer 120.

The first conductive layers 132 may be formed by depositing a conductive material in the gate trenches GT and recessing the conductive material to a predetermined depth from above. The first conductive layers 132 may be formed to have a predetermined height on a lower portion of the gate trenches GT. In the active regions ACT and the device isolation layers 110, upper surfaces of the first conductive layers 132 may be positioned at substantially the same height level.

Figure 7E:
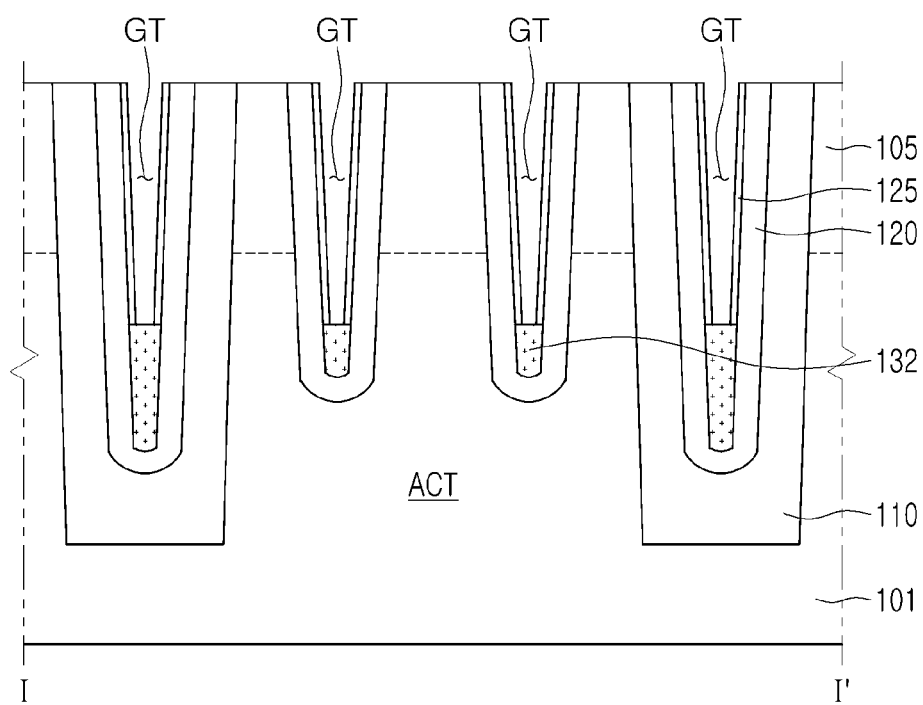

Referring to FIG. 7E, sidewall insulating layers 125 may be formed on the first conductive layers 132 in the gate trenches GT.

The sidewall insulating layers 125 may be formed using, for example, the deposition process of the dielectric material described above with reference to FIG. 7C. The sidewall insulating layers 125 may be formed to have a lesser thickness than the gate dielectric layers 120. When the sidewall insulating layers 125 are made of the same material as the gate dielectric layers 120, a boundary therebetween might not be clearly distinguishable. However, when the sidewall insulating layers 125 are formed of a different material from the gate dielectric layers 120, or have different physical properties even in the case that they are made of the same material, the boundary therebetween may be distinguished and recognized.

Figure 7F:
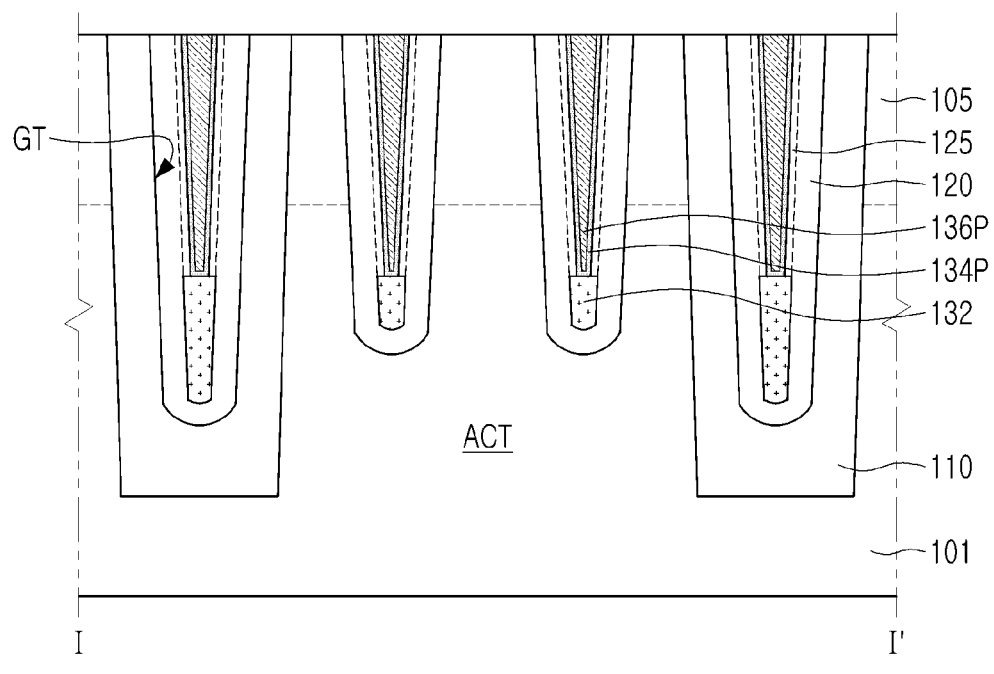

Referring to FIG. 7F, in the gate trenches GT, preliminary second conductive layers 134P and preliminary third conductive layers 136P may be formed on the first conductive layers 132 and the sidewall insulating layers 125.

First, the preliminary second conductive layers 134P may be formed to extend along the first conductive layers 132 and the sidewall insulating layers 125. The preliminary second conductive layer 134P may be a graphene layer, and may extend along the inner side surfaces of the sidewall insulating layers 125 and the upper surface of the first conductive layer 132 with a substantially uniform thickness. The preliminary third conductive layers 136P may be formed to at least partially fill the gate trenches GT.

Figure 7G:
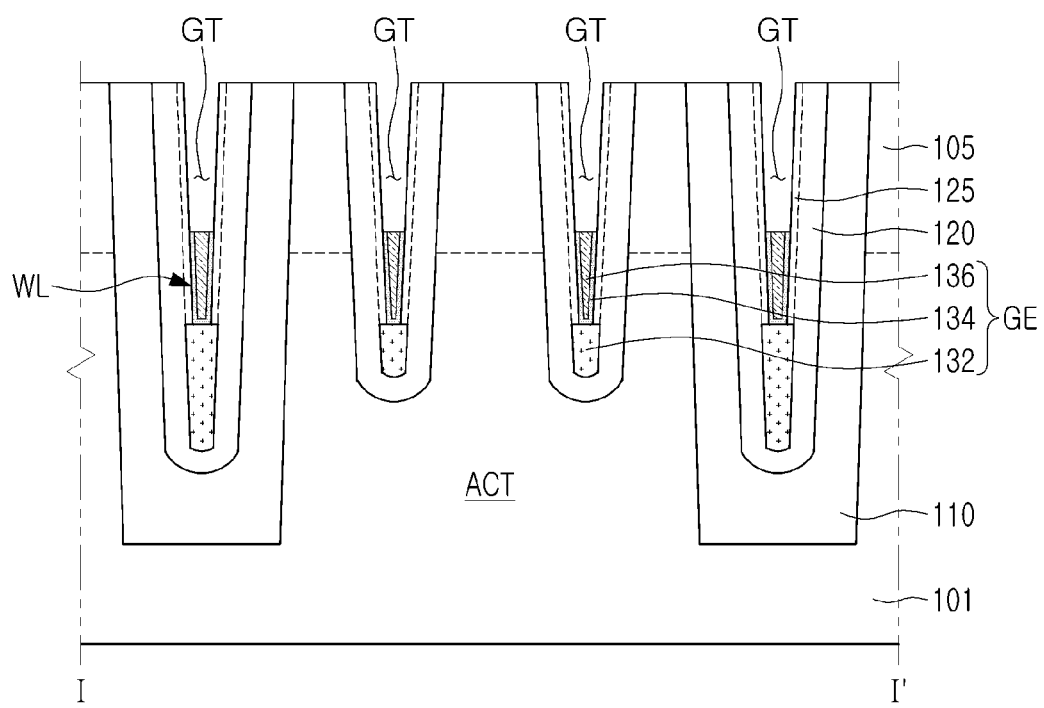

Referring to FIG. 7G, the preliminary second conductive layers 134P and the preliminary third conductive layers 136P may each be partially recessed.

The preliminary second conductive layers 134P and the preliminary third conductive layers 136P may each be removed by being recessed to a predetermined depth from the upper surface of the substrate 101. Accordingly, second conductive layers 134 and third conductive layers 136 may be formed, and gate electrode layers GE including the first conductive layer 132, the second conductive layer 134, and the third conductive layer 136, respectively, may be formed.

Figure 7H:
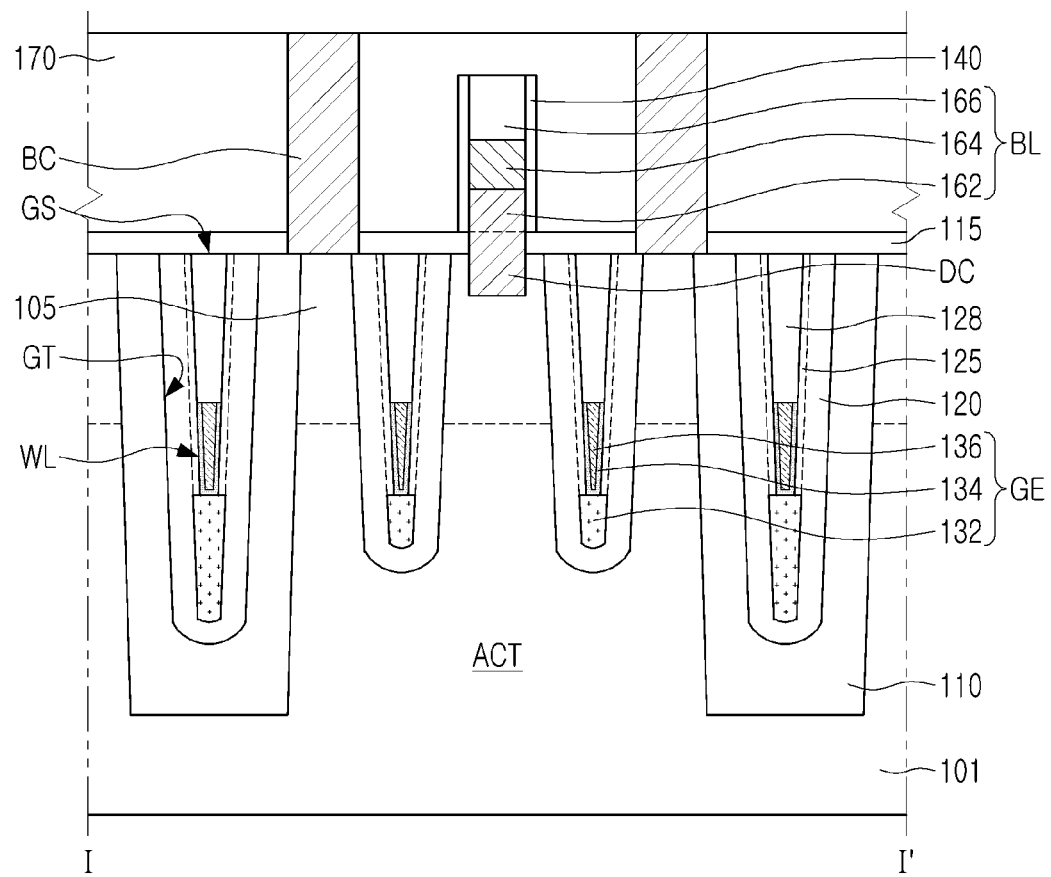

Referring to FIG. 7H, gate structures GS may be formed by forming buried insulating layers 128 in the gate trenches GT, and a bit line BL may be formed on the gate structures GS.

The buried insulating layers 128 may be deposited to fill the gate trenches GT and then may be subjected to a planarization process. Accordingly, gate structures GS including the gate dielectric layer 120, the sidewall insulating layers 125, the gate electrode layer GE, and the buried insulating layer 128, respectively, may be formed.

A bit line BL may be formed by forming a lower insulating layer 115 on the substrate 101, and then sequentially stacking a first bit line conductive layer 162, a second bit line conductive layer 164, and a capping layer 166, before patterning thereof. When the first bit line conductive layer 162 is formed, a direct contact DC may be formed together in a region where the substrate 101 is partially removed. Next, bit line a spacers 140 covering side surfaces of the bit line BL may be formed, and an interlayer insulating layer 170 may be formed. Next, storage node contacts BC connected to the active regions ACT may be formed through the lower insulating layer 115 and the interlayer insulating layer 170.

Next, a capacitor CAP (such as is shown in FIG. 2A) may be formed on the interlayer insulating layer 170. Accordingly, a semiconductor device 100 of FIGS. 2A to 3 may be finally manufactured.

As set forth above, by including a gate electrode layer including grapheme and having an optimized structure, a semiconductor device with increased reliability may be provided.

The various and aspects and elements of the present inventive concept are not necessarily limited to the above description.

While example embodiments have been shown and described above, it will be apparent to those skilled in the art that modifications and variations could be made without departing from the scope of the present inventive concept.

What is claimed is:

1. A semiconductor device, comprising:
   a substrate including an active region; and
   a gate structure in a gate trench in the substrate,
   wherein the gate structure comprises:
      a gate dielectric layer on a bottom surface and inner side surfaces of the gate trench;
      a gate electrode layer on the gate dielectric layer in a lower portion of the gate trench, and including first, second, and third metal layers and a graphene layer contacting an upper surface of the first metal layer and contacting side surfaces of the second and third metal layers; and
      a buried insulating layer on an upper surface of the gate electrode layer.

2. The semiconductor device of claim 1, wherein an upper surface of the graphene layer is in contact with the buried insulating layer.

3. The semiconductor device of claim 1, wherein an outer side surface of the graphene layer is in contact with the gate dielectric layer.

4. The semiconductor device of claim 1, wherein the first and second metal layers have different work functions from each other.

5. The semiconductor device of claim 1, wherein the graphene layer extends between an upper surface of the first metal layer and a lower surface of the second metal layer.

6. The semiconductor device of claim 1, wherein the first and second metal layers have different widths from each other.

7. The semiconductor device of claim 6, wherein the gate structure further comprises sidewall insulating layers on the gate dielectric layer on an upper surface of the first metal layer.

8. The semiconductor device of claim 6, wherein an outer side surface of the first metal layer is in contact with the gate dielectric layer, and
   wherein an outer side surface of the second metal layer is in contact with the graphene layer.

9. The semiconductor device of claim 1, wherein the graphene layer has a smaller thickness than each of the first and second metal layers.

10. A semiconductor device, comprising:
    a substrate including an active region having source/drain regions;
    a gate electrode layer buried in the substrate, and including a plurality of metal layers overlapping each other in a direction perpendicular to an upper surface of the substrate, and a graphene layer at least partially covering a lower surface of any one of the plurality of metal layers, the graphene layer contacting side surfaces of at least two of the plurality of metal layers; and
    a gate dielectric layer between the active region and the gate electrode layer.

11. The semiconductor device of claim 10, wherein the graphene layer is interposed between at least portions of the plurality of metal layers.

12. The semiconductor device of claim 10, wherein the plurality of metal layers have different work functions from each other.

13. The semiconductor device of claim 10, wherein the plurality of metal layers include first and second metal layers sequentially stacked on the gate dielectric layer, and
    wherein the graphene layer is interposed between the first and second metal layers.

14. The semiconductor device of claim 10, wherein the plurality of metal layers include first and second metal layers sequentially stacked on the gate dielectric layer, and
    wherein the graphene layer is interposed between the plurality of metal layers and the gate dielectric layer.

15. A semiconductor device, comprising:
    a substrate including an active region;
    a gate structure extending primarily in a first direction in a gate trench in the substrate;
    a bit line extending primarily in a second direction, intersecting the first direction, on the substrate, the bit line being electrically connected to the active region on a first side of the gate structure; and
    a capacitor on the bit line, and electrically connected to the active region on a second side of the gate structure,
    wherein the gate structure comprises:
    a gate dielectric layer on a bottom surface and inner side surfaces of the gate trench;
    a first conductive layer on the gate dielectric layer, in a lower portion of the gate trench;
    a second conductive layer on the first conductive layer;
    a third conductive layer including graphene and is in contact with side surfaces of each of the first and second conductive layers; and
    a buried insulating layer in an upper portion of the gate trench.

16. The semiconductor device of claim 15, wherein the third conductive layer at least partially surrounds outer side surfaces and a lower surface of at least one of the first and second conductive layers.

17. The semiconductor device of claim 15, wherein the third conductive layer at least partially covers a lower surface of any one of the first and second conductive layers.

18. The semiconductor device of claim 15, wherein an upper surface of the third conductive layer is in contact with the buried insulating layer.

19. The semiconductor device of claim 15, wherein an outer side surface of the third conductive layer is in contact with the gate dielectric layer.

* * * * *